United States Patent [19]

Hoffmann et al.

[11] Patent Number: 4,849,307
[45] Date of Patent: Jul. 18, 1989

[54] PHOTOSENSITIVE RECORDING MATERIALS HAVING A NOVEL GRAFT COPOLYMER BINDER

[75] Inventors: Gerhard Hoffmann, Otterstadt; Horst Koch, Grosskarlbach; Guenther Schulz, Ludwigshafen, all of Fed. Rep. of Germany

[73] Assignee: BASF Aktiengesellschaft, Ludwigshafen, Fed. Rep. of Germany

[21] Appl. No.: 130,216

[22] Filed: Dec. 8, 1987

Related U.S. Application Data

[63] Continuation-in-part of Ser. No. 932,330, Nov. 19, 1986, abandoned.

[30] Foreign Application Priority Data

Nov. 21, 1985 [DE] Fed. Rep. of Germany ....... 3541162

[51] Int. Cl.$^4$ .......................... G03C 1/76; G03C 1/68
[52] U.S. Cl. .................................... 430/271; 430/273; 430/281; 430/905; 430/909; 430/286; 430/287; 522/149; 522/120; 522/121; 522/116; 522/18; 525/404
[58] Field of Search ............... 430/281, 905, 909, 271, 430/273, 286, 287; 522/18, 116, 120, 121, 149; 525/404

[56] References Cited

U.S. PATENT DOCUMENTS

| 2,929,710 | 3/1960 | Martin | 430/281 |
| 3,427,161 | 2/1969 | Laridon | 96/35.1 |
| 3,825,430 | 7/1974 | Kurka | 96/115 R |
| 3,877,948 | 4/1975 | Yonezawa et al. | 96/93 |
| 3,899,338 | 8/1975 | Lewis | 96/115 P |
| 4,019,972 | 4/1977 | Faust | 204/159.15 |
| 4,247,624 | 1/1981 | Foss | 430/281 |
| 4,264,703 | 4/1981 | Chambers et al. | 430/278 |
| 4,272,608 | 6/1981 | Proskow | 430/288 |
| 4,272,611 | 6/1981 | Vyvial et al. | 430/306 |
| 4,415,649 | 11/1983 | Munger et al. | 430/271 |
| 4,497,889 | 2/1985 | Fuerniss | 430/260 |
| 4,517,277 | 5/1985 | Lynch et al. | 430/281 |
| 4,540,743 | 9/1985 | Schulz et al. | 525/61 |

FOREIGN PATENT DOCUMENTS

| 0010690 | 5/1980 | European Pat. Off. . |
| 0079514 | 5/1983 | European Pat. Off. . |
| 0104751 | 4/1984 | European Pat. Off. . |
| 0815277 | 6/1959 | United Kingdom . |
| 0834337 | 5/1960 | United Kingdom . |

Primary Examiner—Jack P. Brammer
Attorney, Agent, or Firm—Keil & Weinkauf

[57] ABSTRACT

The invention relates to a novel photosensitive recording material which can be developed in aqueous solvents after its imagewise irradiation with actinic light and which consists essentially of a dimensionally stable base (A) and of a photosensitive recording layer (B). The said photosensitive recording layer (B) contains from about 48 to about 85% by weight, based on the photosensitive recording layer (B) of one or more elastomeric graft copolymers (B1) which are selected from the group consisting of polyalkylene oxide - vinyl ester - graft copolymers whose vinyl ester structural units have been hydrolyzed to a degree of not less 50 mol.-% from about 0.01 to about 10% by weight, based on the photosensitive recording layer (B), of one or more photoinitiators (B2), and from about 5 to about 30% by weight, based on the photosensitive recording layer (B), of one or more photopolymerizable monomers (B3). In addition to these components, the photosensitive recording layer (B) might contain further assistants or additives. The novel photosensitive recording material is especially well suited for the production of lithographic printing plates, resists and relief plates, in particular relief printing plates. The invention is furthermore related to a process for preparing the novel photosensitive recording material by polymerizing vinylesters in the presence of polyalkylene oxides to yield polyalkylene oxide - vinylester - graft copolymers, hydrolyzing or transesterifying said polyalkylene oxide - vinylester - graft copolymers to yield the said elastomeric graft copolymer (B1), mixing the said elastomeric graft copolymers (B1) with the other components of the photosensitive recording layer (B), and forming the said photosensitive recording layer (B) from the mixture consisting of its components on the dimensionally stable base (A).

14 Claims, No Drawings

PHOTOSENSITIVE RECORDING MATERIALS HAVING A NOVEL GRAFT COPOLYMER BINDER

This application is a continuation-in-part of U.S. patent application Ser. No. 06/932,330, filed Nov. 19, 1986, now abandoned.

The present invention relates to photosensitive recording materials which can be developed in aqueous solvents and consist essentially of a dimensionally stable base (A) and a photosensitive recording layer (B), said layer (B) containing an elastomeric polymeric binder (B1) which is soluble in an aqueous solvent, photopolymerizable monomers (B3), which are compatible with the binder (B1), and photoinitiators (B2). Said photosensitive recording materials are used for the production of relief plates, in particular printing plates for flexographic printing.

Photosensitive recording materials containing a photosensitive recording layer (B) which contains elastomeric binders in general, photopolymerizable monomers (B3) and photoinitiators (B2), are described in, for example German Laid-Open Application DOS No. 3,012,841, U.S. Pats. Nos. 4,415,649 and 3,825,430 and European Pat. No. 104,751. However, the flexographic printing plates produced from these can be developed after imagewise exposure only with the air of relatively large amounts of organic solvents. Although U.S. Pat. No. 4,247,624 describes photosensitive elastomeric mixtures for the production of flexographic printing plates, which contain watersoluble elastomers based on carbamated polyvinyl alcohol derivatives as binders, these elastomers are difficult to prepare and to isolate.

It is an object of the present invention to provide elastomeric polymeric binders (B1) for photosensitive recording materials which can be developed in aqueous solvents after they have been irradiated imagewise with actinic light, the said binders (B1) being soluble in aqueous solvents and easy to prepare and giving relief plates for flexographic printing, including flexographic newspaper printing, which have advantageous properties.

We have found that this object is achieved, according to the invention, by photosensitive elastomeric recording materials which can be developed in aqueous solvents and consist essentially of a dimensionally stable base (A) and a photosensitive recording layer (B), said layer (B) containing (B1) from about 48 to about 85% by weight, based on the photosensitive recording layer (B), of one or more polymeric binders which are elastomeric graft copolymers, said elastomeric graft polymers (i) being soluble in aqueous solvents, (ii) having a residual elongation after the 100% elongation and the subsequent removal of the load of less than 30%, and (iii) being selected from the group consisting of polyalkylene oxide - vinyl ester - graft copolymers which have a degree of hydrolysis of not less than 50 mol% of the said vinyl ester structural units originally incorporated therein before their hydrolysis and which consist essentially of the structural units

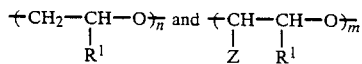

wherein $R^1$ is selected from the group consisting of hydrogen, methyl and ethyl, m is a number of not less than 2, n is a number being always larger than 2, n+m is a number of from 20 to 20,000, and Z is a grafted branch consisting essentially of the structural units

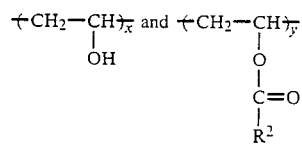

wherein $R^2$ is selected from the group consisting of alkyl and alkylene of 2 to 18 carbon atoms, x and y are positive numbers corresponding with the said degree of hydrolysis of the elastomeric graft copolymers (B1), therefore, x being always a larger number than y, and wherein the numbers n, m, x and y are connected by the equation $$\frac{(n + m)}{(x + y)} = \text{from 1/4 to 3};$$

(B2) from 0.01 to 10% by weight, based on the photosensitive recording layer (B), of one or more photoinitiators which absorb radiation in a wave length range from about 250 to 500 nm, with formation of free radicals; and (B3) from about 5 to 30% by weight, based on the photosensitive recording layer (B), of one or more photopolymerizable olefinically unsaturated compounds being compatible with the said elastomeric graft copolymers (B1).

The elastomeric graft copolymers (B1) used according to the invention are prepared, in a first stage, by polymerization of vinyl esters in the presence of polyalkylene oxides and a free radical polymerization initiator in ratios based on the amounts stated with regard to the composition of the structural units. Suitable vinyl esters are the conventional vinyl esters of aliphatic monocarboxylic acids of 2 to 18 carbon atoms, vinyl acetate being preferred. Preferred polyalkylene oxides are copolymers of propylene oxide and ethylene oxide, containing not less than 50 mol% of ethylene oxide, and in particular polyethylene oxides. In the copolymers, the alkylene oxide units may be randomly distributed or present in the form of blocks, for example forming block copolymers of ethylene oxide and propylene oxide. The number average molecular weights of suitable polyalkylene oxides are in general about 1000 to 100,000, preferably about 4000 to 50,000, corresponding with n+m = from about 20 to about 2000, preferably from about 50 to about 1000.

Suitable free radical polymerization initiators are the known ones, for example peroxides, such as diacetyl peroxide, dibenzoyl peroxide, succinyl peroxide, di-tert.-butyl peroxide, dilauryl peroxide, tert.-butyl perbenzoate or tert.-butyl hydroperoxide, and azobisisobutyronitrile and mixtures of these, the initiators being used in conventional amounts. Benzoyl peroxide and lauryl peroxide are preferred. The initiators are used in amounts of from about 0.1 to 10, in particular 0.2 to 2, preferably 0.5 to 1.5% by weight, based on the amount of vinyl ester.

A temperature in the range of from 50 to 150° C., preferably of from 80 to 120° C., is advantageously chosen as the polymerization temperature for the vinyl ester n the presence of the polyalkylene oxides.

The graft copolymers can be prepared by dissolving the polyalkylene oxides in the vinyl ester, adding the initiator and the carrying out polymerization continuously or batchwise. It has proven particularly advantageous to carry out the graft copolymerization of the vinyl ester in the presence of the polyalkylene oxides in such a way that the monomer concentration remains very low during the polymerization. This can advantageously be achieved if the polyalkylene oxides are initially taken and heated to the polymerization temperature, and a vinyl ester/initiator mixture is slowly added batchwise or, preferably, continuously. It has proven useful to feed in the said mixture at 90° C. in the course of about 2 to 6 hours. The graft polymerization is advantageously carried out in the absence of a solvent, preferably in molten polyalkylene oxide. The resulting polyalkylene oxide - vinyl ester - graft copolymers generally have a K value, according to H. Fikentscher, of from 10 to 200, preferably from 20 to 100 (determined in 1% strength solution in ethyl acetate at 25° C. In the resulting polyalkylene oxide - vinyl ester graft copolymer, the number of ungrafted alkylene oxide structural units (n) must be greater than the number of grafted units (m) although m must not be less than 2. The amount of grafted vinyl ester should generally be from ⅓ to 4 times the molar amount of alkylene oxide structural units in the polyalkylene oxide initially taken, in particular 30-60 mol% of the polyalkylene oxide - vinyl ester - graft copolymer.

Thereafter, the ester groups in the resulting polyalkylene oxide - vinyl ester - graft polymer can be completely or partially hydrolyzed in a conventional manner by adding a base, such as a sodium hydroxide solution or potassium hydroxide solution, or an acid, hydrolysis or partial hydrolysis also being understood as transesterification in which vinyl alcohol structural units are formed. Transesterification using from 0.02 to 2%, based on the amount of vinyl ester employed, of sodium hydroxide as a catalyst in from 20 to 60% strength methanolic solution of the polyalkylene oxide - vinyl ester - graft copolymer at from 20 to 30° C. has proven advantageous. The gel formed during this procedure is dissolved by adding water and the catalyst is then neutralized with, for example, acetic acid.

The desired degree of hydrolysis of the resulting elastomeric graft copolymer (B1) depends not only n the type of initially taken polyalkylene oxide and vinyl ester but in particular on the desired solubility in an aqueous solvent or water alone. In general, the degree of hydrolysis is not less than 50, preferably from about 65 to 99, mol% of the vinyl ester structural units which were originally incorporated in the polyalkylene oxide - vinyl ester -graft copolymers before their hydrolysis. Preferably, the amount of $-CH_2-CH-O-CO-R^2-$vinyl ester groups is less than 20, in particular less than 10 mol%. The said degree of hydrolysis of from 65 to 99 mol% of the vinyl ester structural units corresponds with a ratio of (x:y) of from about 1.857 to about 99, x and y always being positive numbers and x always being a larger number than y.

If it is desired to prepare elastomeric graft copolymers (B1) which possess olefinically unsaturated side groups and thus permit photocrosslinking of the elastomeric graft copolymers (B1) or, when photopolymerizable monomers (B3) are concomitantly used, accelerate photocrosslinking, it is advantageous for such groups to be introduced into the elastomeric graft copolymers (B1) as side groups, after the hydrolysis or partial hydrolysis of the polyalkylene oxide - vinyl acetate - graft copolymers, by reacting hydroxyl groups of the vinyl alcohol structural units with olefinically unsaturated compounds which possess reactive groups capable of reacting with hydroxyl. This can be effected, for example, by reaction with an ester, a chloride or, preferably, an anhydride of an olefinically unsaturated carboxylic acid, such as acrylic acid, methacrylic acid, crotonic acid or maleic acid. In this context, reference may be made to German Laid-Open Applications DOS No. 3,144,905 and DOS No. 3,322,993 or to the description of a similar esterification in, for example, U.S. Pats. Nos. 2,929,710 and 3,427,161, British Pat. No. 834,337 or German Laid-Open Application DOS No. 1,522,359. Although the amount of double bonds in side groups introduced in this manner is determined by the desired water solubility and the intended use of the binders (B1), the elastomeric graft copolymers (B1) containing from about 2 to 15 mol% of acrylate and/or methacrylate groups have proven particularly useful as binders (B1) for water-developable photosensitive recording layers (B). When they have a fairly high content of unsaturated double bonds, they can be used, together with photoinitiators (B2), in photocrosslinkable recording layers (B), even with the addition of very little, if any, photopolymerizable monomers (B3).

The elastomeric graft copolymers (B1) used according to the invention have elastomeric properties, ie. they have a glass transition temperature of less than 20° C., preferably less than 0° C. The elastomeric graft copolymers (B1) undergo elastomeric (entropy-elastic) deformations. After 100% elongation and subsequent removal of the load, they exhibit a residual elongation of less than 30%, preferably less than 20%, eg. of from about 10 to 20%. The tensile stress for 100% elongation, ie. elongation to twice the initial length, is preferably less than $10^7$ Pa. Particularly suitable elastomeric graft copolymers (B1) have an elongation at break of not less than 100%, preferably not less than 150%. It is of course possible to use them as a mixture with other compatible polymeric binders for recording materials. In the photosensitive recording layer (B) the elastomeric graft copolymers (B1) are used a polymeric binders (B1) in an amount of from about 48 to about 85, preferably from about 49 to about 80% by weight, based on the photosensitive recording layer (B).

In the preferred embodiments, the polymeric binders (B1) are processed as a mixture with one or more photopolymerizable olefinically unsaturated compounds (B3) which are compatible with the polymeric binder (B1), with the addition of a photoinitiator (B2), to give photosensitive recording layers (B). Compatibility in this context is the ability of different components to remain dispersed in one another without producing substantial scattering of actinic light. Mixtures of incompatible components exhibit pronounced cloudiness. Examples of suitable monomers (B3) possessing one or more photopolymerizable olefinically unsaturated double bonds are the compatible mono- and diacrylates and -methacrylates of dihydric or polyhydric alcohols, such as ethylene glycol, di-, tri-, tetra- and polyethylene glycols, the latter preferably containing from 10 to 15 ethylene glycol units, propane-1,3-diol, glycerol, 1,1,1-trimethylolpropane, butane-1,2,4-triol and pentaerythritol, eg. ethylene glycol monomethacrylate, propane-1,3-diol monomethacrylate, glycerol mono- and diacrylate, butane-1,2,4-triol monomethacrylate, pentaerythritol triacrylate, w-methylpolyethylene glycol monoacrylate, tetradecaethylene glycol dimethacrylate and the triether of glycerol and 3 moles of N-methylolacrylamide or -methacrylamide. The amount of monomers mixed in is in general from about 5 to about 30, preferably from about 10 to about 25% by weight, based on the photosensitive recording layer (B), and depends on the compatibility and desired exposure time, the hardness and other performance characteristics of the photosensitive recording materials or of the relief plates produced from them. In general, the said relief plates should possess elastomeric properties.

Suitable photoinitiators (B2) for the photosensitive recording layers (B) of the novel photosensitive recording materials are the conventional ones which have adequate thermal stability during processing of the recording materials, form a sufficient number of free radicals during exposure with initiation of photopolymerization of the monomers (B3) or initiation of photocrosslinking of the elastomeric graft copolymers (B1) containing unsaturated side groups. They should absorb radiation in a wavelength range from about 250 to about 500 nm, with formation of free radicals. Examples of suitable photoinitiators (B2) are acyloins and their derivatives, such as benzoin, benzoin alkyl ethers, eg. benzoin isopropyl ether, α-methylolbenzoin and its ethers, such as α-methylolbenzoin methyl ether, vicinal diketones and their derivatives, eg. benzil acetals, such as benzil dimethyl ketal, and preferably acylphosphine oxide compounds, such a 2,6-diethoxybenzoyldiphenylphosphine oxide and in particular 2,4,6-trimethylbenzoyldiphenylphosphine oxide. The photoinitiators (B2) may also be used in a conventional manner as a mixture with one another or in conjunction with coinitiators or activators, such as Michlers ketone and its derivatives or 2-alkyl-anthraquinones. The amount of photoinitiator (B2) is in general from about 0.01 to about 10, preferably from about 0.5 to about 5, % by weight of the photosensitive recording layer (B).

It is often advantageous to add to the photosensitive recording layer (B) further assistants and additives, such as thermal polymerization inhibitors, eg. hydroquinone and its derivatives, 2,6-di-tert.-butyl-p-cresol, nitrophenols, nitrosamines, such as N-nitrosodiphenyl-amine or salts of N-nitrosocycolhexyl-hydroxylamine, eg. its alkali metal or aluminum salts. Other conventional additives are dyes, pigments, processing assistants and plasticizers. The elastomeric graft copolymers (B1) used according to the invention are distinguished in particular by their good compatibility with plasticizers such ethylene glycol, polyethylene glycol, glycerol, N-alkyl-benzenesulfonamides or dialkyl phthalates, some of which can be added to the photosensitive recording layer (B) in amounts of from about 5 to about 40, preferably from about 10 to about 30, % by weight, based on the photosensitive recording layer (B).

The novel photosensitive recording materials which consist essentially of a dimensionally stable base (A) and the said photosensitive recording layer (B), can be prepared by mixing the components and solvents, or by mixing in a kneader or extruder. The homogeneous mixtures are generally applied in a thickness of from 25 to 6000 μm, preferably from 200 to 300 μm, onto a conventional dimensionally stable base (A); if necessary, intermediate layer, for example for improving adhesion, may also be present between the photosensitive recording layer (B) and the base (A). Examples of suitable bases (A), depending on the intended use, are polyester films, steel or aluminum sheets, foam layers and elastomeric bases. It may also be advantageous to apply a cover sheet or protective layer, for example a thin layer of polyvinyl alcohol or of polyvinyl alcohol/polyethylene oxide graft copolymers, onto the photosensitive recording layer (B).

The photosensitive recording materials according to the invention can be processed in a conventional manner to give lithographic printing plates, resists and relief plates, in particular printing plates. To do this, the photosensitive recording layer (B) of the novel photosensitive recording material is generally exposed imagewise to actinic light from light sources such as UV fluorescent tubes, high pressure, medium pressure or low pressure mercury lamps, fluorescent tubes, etc., the wavelength preferably being of from 300 to 420 nm. The unexposed and uncrosslinked parts of the irradiated recording layer (B) can be removed by spraying, washing, brushing, etc. with aqueous solvents or water. An advantage of the elastomeric graft copolymers (B1) preferably used according to the invention as polymeric binders (B1) is that they can be washed out with pure water, without the addition or organic solvents. Advantageously, developed relief and printing plates are dried at up to 120° C. and, if necessary, are simultaneously or subsequently postexposed to actinic light.

The printing plates produced from novel photosensitive recording materials are particularly useful for flexographic printing, flexographic newspaper printing and similar methods of printing.

The Experiments and Examples which follow illustrate the invention. Parts and percentages are by weight, unless stated otherwise. Parts by volume bear the same relation to parts by weight as that of the liter to the kilogram. The Shore hardness was measured according to DIN 53,505.

PREPARATION OF GRAFT COPOLYMERS

EXPERIMENT A 360 parts of polyethylene oxide having a means molecular weight of 9000 g/mole corresponding with n+m=204.5, are heated to 90° C. under nitrogen and are thus melted. A solution of 2 parts of benzyl peroxide in 440 parts of vinyl acetate is added dropwise to this stirred melt at a rate which is just sufficiently rapid to produce gentle refluxing of unconverted vinyl acetate. Polymerization is then completed in the course of from 4 to 6 hours at 90° C. yielding a polyalkylene oxide - vinyl ester-graft copolymer with $$\frac{(n + m)}{(x + y)} = 1.6$$

The said graft copolymer is cooled to about 60° C., after which 800 parts of methanol are added. The resulting solution is cooled to room temperature, and the transesterification of the acetate groups is then initiated by adding 24 parts of a 10% strength methanolic sodium hydroxide solution, the solution gelling during this procedure. After a reaction time of from 8 to 10 hours at from 20 to 30° C., the gel is dissolved by adding 1400 parts of water, the solution is neutralized with glacial acetic acid and the product is precipitated in a large excess of acetone. Films of the thus prepared elastomeric graft copolymer (B1) which are cast from water exhibit elastomeric behavior. The ester number of the elastomeric graft copolymer (B1) is 14 mg/g corresponding with a degree of hydrolysis of more than 65 mol% of the vinyl acetate structural units originally incorporated in the precursor, the alkylene oxide - vinyl ester -graft copolymer, and with $$\frac{(n + m)}{(x + y)} = 1.6$$

The residual elongation after 50% elongation and subsequent removal of the load of the elastomeric graft copolymer is 19%, and the elongation at break is 14 MPa.

EXPERIMENT B

The procedure described in Experiment A is followed, except that 400 parts of polyethylene oxide having a molecular weight of 12,000 g/mole corresponding with n+m +272.72, and 600 parts of a solution of 10 parts of benzoyl peroxide in 1500 parts of vinyl acetate are used. The resulting elastomeric graft copolymer (B1) has an ester number of 53 mg/g corresponding with a degree of hydrolysis of more than 65 mol% of the vinyl ester structural units originally incorporated in the precursor, the polyalkylene oxide - vinyl acetate - graft copolymer, and with $$\frac{(n + m)}{(x + y)} = 1.303$$

The elastomeric graft copolymer (B1) has a residual elongation of 14% after temporary elongation to one and a half times the initial length, and an upper tensile stress of 8 MPA.

EXPERIMENT C

The procedure described in Experiment A is followed, except that 400 parts of polyethylene oxide having a means molecular weight of 9000 g/mole corresponding with n+m=204.5, and 800 parts of a 1% strength solution of benzoyl peroxide in vinyl acetate are used. The resulting elastomeric graft copolymer (B1) has an ester number of 156 mg/g corresponding with a degree of hydrolysis of more than 60 mol.-% of the vinyl ester structural units originally incorporated in the precursor, the polyalkylene oxide - vinyl acetate - graft copolymer, and with $$\frac{(n + m)}{(x + y)} = 0.977.$$

The elastomeric graft copolymer (B1) is relatively soft but has very good resilience, the residual elongation being 2% (measured as described under Experiment B); the tensile stress at 50% elongation is 2 MPa.

EXPERIMENT D

The procedure described in Experiment C is followed, except that 50 parts of 10% strength methanolic sodium hydroxide solution are used for the transesterfication of the polyalkylene oxide-vinyl acetate graft copolymer. The resulting elastomeric graft copolymer (B1) has an ester number of 32 mg/g corresponding with a degree of hydrolysis of more than 65 mol.-% of the vinyl ester structural units originally incorporated in the precursor, the polyalkylene oxide - vinyl acetate - graft copolymer, and with $$\frac{(n + m)}{(x + y)} = 0.977.$$

The elastomeric graft copolymer (B1) is harder and has a higher tensile strength than the product prepared as described in Experiment C. The residual elongation (measured as described in Experiment C) is 9%, and the tensile stress at 50% elongation is 4 MPa and the elongation at break is higher than 200%.

EXPERIMENT E 120 parts of the elastomeric graft copolymer (B1) prepared according to Experiment D and thoroughly dried are dissolved in 480 parts of dimethylformamide. 2.4 parts of 2,6-di-tert.-butyl-4-methylphenol, 0.6 part of p-dimethylaminopyridine and 22 parts of methacrylic anhydride are added. The solution is stirred fro 8 hours at 60° C. and the resulting product is then precipitated in 6000 parts by volume of acetone, filtered off and dried. The resulting elastomeric graft copolymer (B1) contains 4 mol.% of methacrylate groups as olefinically unsaturated side groups.

EXPERIMENT F

The procedure described in Experiment E is followed except that 120 parts of the elastomeric graft polymer (B1) prepared according to Experiment A and thoroughly dried, 60 parts of methacrylic anhydride and 1.8 parts of p-dimethylaminopyridine are used. The resulting elastomeric graft copolymer (B1) contains 11 mol.% of methacrylate groups as olefinically unsaturated side groups.

EXPERIMENT G

The procedure described in Experiment D is followed, except that 400 parts of a polyethylene oxide having a means molecular weight of 35,000 g/mole corresponding with n+m =795.45, and 400 parts of 0.75% strength solution of benzoyl peroxide in vinyl acetate are used. The resulting elastomeric graft copolymer (B1) has an ester number of 13 mg/g corresponding with a degree of hydrolysis of more than 65 mol.% of the vinyl ester structural units originally incorporated in the precursor, the polyalkylen oxide - vinylester ester - graft copolymer and with $$\frac{(n + m)}{(x + y)} = 1.95.$$

Furthermore, the elastomeric graft copolymer (B1) has a good resilience. Elongation of an appropriate specimen to twice its initial length requires a stress of 4.9 MPa; after removal of the load, the residual elongation is about 30%.

EXPERIMENT H

The procedure described in Experiment G is followed, except that 800 parts of a 1% strength solution of benzoyl peroxide in vinyl acetate are used. The resulting elastomeric graft copolymer (B1) corresponds with $$\frac{(n + m)}{(x + y)} = 0.977,$$

has about the same hardness as that prepared according to Experiment G but exhibits improved resilience. The residual elongation of the specimen after elongation by 100%, based on the initial length, and subsequent removal of the load is about 13%.

PREPARING AND PROCESSING OF PHOTOSENSITIVE RECORDING MATERIALS ACCORDING TO THE INVENTION

EXAMPLE 1

A photosensitive recording material is prepared from 77.1 parts of the elastomeric graft copolymer (B1) prepared as described in Experiment A, 10 parts of ethylene glycol, 10 parts of tetraethylene glycol diacrylate, 2 parts of benzil dimethyl ketal, 0.03 part of the dye Duasyn Basic Red TH (C.I. 50240), 0.4 part of the potassium salt of N-nitrosocyclohexylhydroxylamine and 0.5 part of 2,6-di-tert.-butyl-p-cresol by kneading in a plastograph at 130° C. The mixture is pressed onto a steel base (A) at 130° C. so that a photosensitive recording layer (B) about 1000 μm thick results. Thereafter, the photosensitive recording layer (B) is exposed directly through a negative for 15 minutes, developed with pure water for 3 minutes at 40° C. is a spray washer and dried to give a resilient relief which has a smooth, non-tacky surface with a Shore A hardness of 90.

EXAMPLE 2

A mixture is prepared, as described in Example 1, from 77.1 parts of the elastomeric graft copolymer (B1) prepared as described in Experiment A, 10 parts of methylpolyethylene glycol acrylate (containing about 14 ethylene glycol structural units in the molecule), 10 parts of tetraethylene glycol monoacrylate and 2 parts of benzil dimethyl ketal. The mixture is pressed onto a 125μm thick polyester film at 130° C. so that a photosensitive recording layer (B) about 1000 μm thick results. Thereafter, the photosensitive recording layer (B) is exposed through a negative for 15 minutes, developed with pure water for 2 minutes in a spray washer and dried to give a relief having a shore A hardness of 82. The increase in weight due to swelling in oil-based inks typically used in flexographic printing is less than 6%.

EXAMPLE 3

A mixture is prepared, as described in Example 1, from 67 parts of the elastomeric graft copolymer (B1) prepared as described in Experiment 8, 20 parts of ethylene glycol, 10 parts of tetraethylene glycol monoacrylate and 3 parts of 2,4,6-trimethylbenzoyldiphenylphosphine oxide and is processed to a photosensitive recording layer (B) on a steel sheet. The photosensitive recording layer (B) is exposed imagewise for 15 minutes and then developed for 3 minutes by washing with water. The resulting plate has a Shore A hardness of 70 and its increase in weight due to swelling in oil-based inks typically used in flexographic printing is 2%.

EXAMPLE 4

78.1 parts of the elastomeric graft copolymer (B1) according to Experiment E, 20 parts of tetraethylene glycol diacrylate, 1 part of benzil dimethyl ketal, 0.5 part of 2,6-di-tert.-butyl-p-cresol, 0.4 part of the potassium salt of N-nitrosocyclohexylhydroxylamine and 0.03 part of the dye Duasyn Basic Red TH (C.I. 50240) are dissolved in an n-propanol/water mixture (volume ratio 1:5). The solution is cast onto a 125 μm thick polyester film so that the thickness of the resulting dry photosensitive recording layer (B) is about 1000 μm. The photosensitive recording layer (B) is then exposed imagewise for 20 minutes and developed for 5 minutes with pure water in a spray washer. The dry plate has a Shore D hardness of 67.

EXAMPLE 5

16 ppm of dibenzanthrone are added to 74.2 parts of the elastomeric graft copolymer (B1) prepared as described in Experiment B, 12 parts of a triether of glycerol with 3 moles of N-methylolacrylamide, 8 parts of the dimethacrylate of a polyethylene glycol containing on the average 14 ethylene glycol units, 1.5 parts of benzoin isopropyl ether, 0.3 part of hydroquinone monomethyl ether and 4 parts of N-n-butyl-benzenesulfonamide, and the mixture is dissolved in a mixture of 40% of methanol and 60% of water. The solution is applied by means of a knife coater onto a sheet steel base provided with a primer and topcoat, the thickness of the wet layer of the solution being such that a dry photosensitive recording layer (B) having a thickness of 0.3 mm remains after drying, said drying being generally effected at 50° C. for 2 hours and then at 80° C. for 22 hours. The residual moisture content is brought to 5±0.3%. The photosensitive recording layer (B) is transparent and non-tacky at the surface.

After imagewise exposure to an iron-doped mercury lamp having a power rating of 5 kW for 90 seconds, washout is carried out under mild conditons with lukewarm water, resulting in a satisfactory relief structure. Drying the plate for 10 minutes at 90° C. with simultaneous post-exposure to light from adapted neon tubes gives a printing plate which produces excellent prints on very rough and thin newsprint in a lithographic printing press, using oil-based ink. The photopolymerized former photosensitive recording layer(B) has a Shore A hardness of 72 according to DIN 53,305.

EXAMPLE 6

The procedure described in Example 5 is followed, except that the elastomeric graft copolymer (B1) prepared as described in Experiment A is used. A similar resilient printing plate having a Shore A hardness of 83 results. This printing plate gives excellent printing results.

EXAMPLE 7

48.9 parts of the elastomeric graft copolymer (B1) prepared as described in Experiment G, 24.5 parts of a N-n-butylbenzene-sulfonamide, 24.5 parts of a reaction product of 1 mole of butane-1,4-diol diglycidyl ether with 2 moles of acrylic acid, 1.2 parts of benzil dimethyl ketal, 0.03 part of the dye Duasyn Basic Red TH (C.I. 50240), 0.5 part of 2,6-di-tert.-butyl-p-cresol and 0.4 part of thepotassium salt of N-nitrosocyclohexylhydroxylamine were dissolved in an n-propanol/water mixture (volume ratio 1:3). The solution is cast onto a polyester film so that a dry photosensitive recording layer (B) being 700 μm thick results. The photosensitive recording layer (B) is then laminated with a flexible and resilient base covered with a 75 μm polyester film. Exposure from the back for 20 seconds, principal imagewise exposure for 15 minutes, development with water for 5 minutes in a spray washer and drying give a flexible and resilient printing plate whose photopolymerized former photosensitive recording layer (B) has a Shore A hardness of 50.

We claim:
1. A photosensitive recording element which can be developed in aqueous solvents after its imagewise irradiation with actinic light and which comprising (A) a dimensionally stable base and
(B) a photosensitive recording layer consisting essentially of the following components:
(B1) from about 48 to 85% by weight, based on the photosensitive recording layer (B), of one or more polymeric binders which are elastomeric graft copolymers, said elastomeric graft copolymers (i) being soluble in aqueous solvents, (ii) having a residual elongation after the 100% elongation and after the subsequent removal of the load of less than 30%, and (iii) being polyalkylene oxide - vinyl ester - graft copolymners which have a degree of hydrolysis of not less than 50 mol.-% of the said vinylester structural units originally incorporated therein before their hydrolysis and which consist essentially of the structural units

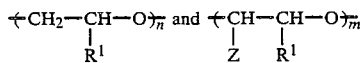

wherein $R^1$ is selected from the group consisting of
hydrogen, methyl and ethyl, m is a number of not less than 2, n is a number being always larger than 2, n +m is a number of from 20 to 20,000, and Z is a grafted branch consisting essentially of the structural units

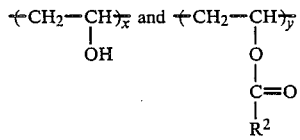

wherein $R^2$ is selected from the group consisting of alkyl and alkylene of 2 to 18 carbon atoms, x and y are positive numbers corresponding with the said degree of hydrolysis of the elastomeric graft copolymers (B1), therefore, x being always a larger number than y, and wherein the numbers n, m, x and y are connected by the equation $$\frac{(n+m)}{(x+y)} = \text{from 1/4 to 3};$$

(B2) from 0.01 to 10% by weight, based on the photosensitive recording layer (B) of one or more photoinitiators which absorb radiation in a wavelength range from about 250 to 500 nm, with formation of free radicals; and
(B3) from about 5 to about 30% by weight, based on the photosensitive recording layer (B), of one or more photopolymerizable olefinically unsaturated compounds being compatible with the elastomeric graft copolymers (B1) as monomers.

2. The photosensitive recording element of claim 1, wherein the said elastomeric graft copolymers (B1) have a tensile stress for the 100% elongation of less than $10^7$Pa and a glass transition temperature of less than 20° C.

3. The photosensitive recording element of claim 2, wherein the said elastomeric graft copolymers (B1) have an elongation at break of not less than 100%.

4. The photosensitive recording element of claim 1, wherein the radicals $R^2$ are carrying carboxyl groups.

5. The photosensitive recording element of claim 1, wherein the radical $R^2$ is methyl.

6. The photosensitive recording element of claim 1, wherein the polyalkylene oxide of the said elastomeric graft copolymers (B1) is selected from the group consisting of random copolymers of propylene oxide and ethylene oxide containing not less than 50 mol.-% of ethylene oxide, of propylene oxide - ethylene oxide block copolymers containing not less than 50 mol.% of ethylene oxide, and of ethylene oxide.

7. The photosensitive recording element of claim 6, wherein the polyalkylene oxide of the said elastomeric graft copolymers (B1) have a number average molecular weight of from 1000 to 100,000.

8. The photosensitive recording element of claim 1, wherein the said elastomeric graft copolymers (B1) contain, before their hydrolysis, the said grafted vinyl ester units in an amount of from 30 to 60 mol.-% of the unhydrolyzed polyalkylene oxide - vinyl ester -graft copolymers.

9. The photosensitive recording element of claim 1, wherein the said elastomeric graft copolymers (B1) contain the said vinyl ester units

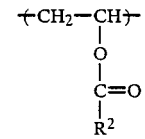

incorporated therein in an amount of less than 20 mol.-% of the said elastomeric graft polymers (B1).

10. The photosensitive recording element of claim 1, wherein the said elastomeric graft copolymers (B1) having a degree of hydrolysis of from 65 to 99 mol.-% of the said vinyl ester structural units originally incorporated in the unhydrolyzed polyalkylene oxide - vinyl ester - graft copolymers.

11. The photosensitive recording element of claim 1, wherein the said elastomeric graft copolymers (B1) additionally contain olefinically unsaturated side groups.

12. The photosensitive recording element of claim 11, wherein the said elastomeric graft copolymers (B1) contain acrylate or methacrylate groups as the said olefinically unsaturated side groups in an amount of from 2 to 15 mol.-% of the said elastomeric graft copolymers (B1).

13. The photosensitive recording element of claim 1, wherein the photosensitive recording layer (B) additionally contains further assistants and additives selected from the group consisting of thermal polymerization inhibitors, dyes, pigments, plasticizers and other compatible polymeric binders.

14. The photosensitive recording element of claim 1, wherein a cover sheet or a protective layer is applied onto the photosensitive recording layer (B).

* * * * *